United States Patent [19]

DiMeo, Jr. et al.

[11] Patent Number: 5,972,430
[45] Date of Patent: Oct. 26, 1999

[54] DIGITAL CHEMICAL VAPOR DEPOSITION (CVD) METHOD FOR FORMING A MULTI-COMPONENT OXIDE LAYER

[75] Inventors: Frank DiMeo, Jr., New Milford; Steven M. Bilodeau, Newtown; Peter C. Van Buskirk, Oxford, all of Conn.

[73] Assignee: Advanced Technology Materials, Inc., Danbury, Conn.

[21] Appl. No.: 08/979,465

[22] Filed: Nov. 26, 1997

[51] Int. Cl.$^6$ .................................................. C23C 16/40
[52] U.S. Cl. .............................. 427/255.32; 427/225.31; 427/225.36; 427/576; 427/553; 427/554; 505/473; 505/480
[58] Field of Search .................... 427/255.28, 255.29, 427/255.31, 225.32, 255.36, 255.395, 553, 554; 505/473, 480

[56] References Cited

U.S. PATENT DOCUMENTS

| | | |
|---|---|---|
| 4,058,430 | 11/1977 | Suntola et al. . |
| 4,413,022 | 11/1983 | Suntola et al. . |
| 5,102,694 | 4/1992 | Taylor et al. . |
| 5,138,520 | 8/1992 | McMillan et al. . |
| 5,164,040 | 11/1992 | Eres et al. . |
| 5,330,610 | 7/1994 | Eres et al. . |
| 5,439,876 | 8/1995 | Graf et al. . |
| 5,451,260 | 9/1995 | Versteeg et al. . |
| 5,648,321 | 7/1997 | Bednorz et al. . |

OTHER PUBLICATIONS

Fujii et al, Jpn. J. Appl. Phys. vol. 31 pp. L787–789, Jun. 1992.

Buchholz, et al, "In–Plane Orientation Control of (001) Yba$_2$Cu$_3$O$_{7-}$ Grown on (001) MgO by Pulsed Organometallic Beam Epitaxy", Appl. Phys Lett., 68 (21), May 20, 1996, pp. 3037–3039.

Duray, et al, "Pulsed Organometallic Beam Epitaxy of Complex Oxide Films", Appl. Phys. Lett., 59 (12), Sep. 16, 1991, pp. 1503–1505.

Hirai, et al, "Preparation of Perovskite Orientated PbZr$_x$Ti$_{1-x}$O$_3$ Films with Suppressed Vapor Phase Reactions by a Digital Chemical Vapor Deposition Method", Jpn. J. Appl. Phys., vol. 34, Part I, No. 2A, Feb. 1995, pp. 539–543.

Sotome, et al, "C–Axis–Oriented Pb(Zr, Ti)O$_3$ Thin Films Prepared by Digital Metalorganic Chemical Vapor Deposition Method", Jpn. J. Appl. Phys., vol. 33, Part I, No. 7A, Jul. 1994, pp. 4066–4069.

Xie, et al, "Epitaxial LiTaO$_3$ The Film by Pulsed Metalorganic Chemical Vapor Deposition from a Single Precursor", Appl. Phys. Lett., 63(23), Dec. 6, 1993, pp. 3146–3148.

Ikegawa, et al, "Growth of CeO$_2$ Thin Films by Meal–Organic Molecular Beam Epitaxy", Thin Solids Films, vol. 282, Iss. 1–2, 1996, pp. 60–63.

Primary Examiner—Roy V. King
Attorney, Agent, or Firm—Steven J. Hultquist; Oliver A.M. Zitzmann

[57] ABSTRACT

A chemical vapor deposition (CVD) method for forming a multi-component oxide layer. There is first provided a chemical vapor deposition (CVD) reactor chamber. There is then positioned within the chemical vapor deposition (CVD) reactor chamber a substrate. There is then formed over the substrate a multi-component oxide precursor layer. The multi-component oxide precursor layer is formed from at minimum a first precursor reactant source material and a second precursor reactant source material introduced simultaneously into the chemical vapor deposition (CVD) reactor chamber in absence of an oxidant reactant source material. There is then oxidized with the oxidant reactant source material within the chemical vapor deposition (CVD) reactor chamber the multi-component oxide precursor layer formed over the substrate to form a multi-component oxide layer formed over the substrate. The oxidant reactant source material is introduced into the chemical vapor deposition (CVD) reactor chamber in absence of the first precursor reactant source material and the second precursor reactant source material.

24 Claims, 4 Drawing Sheets

DIGITAL CHEMICAL VAPOR DEPOSITION (CVD) METHOD FOR FORMING A MULTI-COMPONENT OXIDE LAYER

BACKGROUND OF THE INVENTION

1. Field of the Invention

The present invention relates generally to methods for forming multi-component oxide layers over substrates. More particularly, the present invention relates to chemical vapor deposition (CVD) methods for forming multi-component oxide layers over substrates.

2. Description of the Related Art

As technologies such as microelectronics fabrication technology and sensor element fabrication technology have advanced, there has evolved a continuing and accelerating interest in the use of multi-component oxide thin film layers within thin film fabrications such as but not limited to thin film microelectronics fabrications and thin film sensor element fabrications. Such multi-component oxide thin film layers are typically generally formed in such applications at thicknesses of less than about 20000 Angstroms, and more typically and more preferably at thicknesses of from about 50 to about 4000 Angstroms.

Multi-component oxide thin film layers are desirable in the aforementioned thin film microelectronics fabrications and thin film sensor element fabrications since such thin film layers may be formed to simultaneously possess several unique properties, such as but not limited to unique dielectric properties, ferroelectric properties, piezoelectric properties and/or pyroelectric properties which are often desirable, and not otherwise readily obtainable. Of particular interest in advanced thin film microelectronics fabrications are perovskite multi-component oxide thin film layers, such as but not limited to barium strontium titanate (BST) layers and lead zirconium titanate (PZT) layers, since such perovskite multi-component oxide thin film layers possess enhanced dielectric properties appropriate for use within high areal capacitance capacitors for advanced thin film microelectronics fabrications such as but not limited to advanced dynamic random access memory (DRAM) integrated circuit thin film microelectronics fabrications.

Of the methods for forming multi-component oxide thin film layers, such as perovskite oxide thin film layers, for thin film fabrications such as thin film microelectronics fabrications and thin film sensor element fabrications, chemical vapor deposition (CVD) methods and related epitaxial deposition methods, such as but not limited to atomic layer epitaxial (ALE) deposition methods, are in turn also presently of substantial interest. Additional variations upon chemical vapor deposition (CVD) methods and epitaxial deposition methods for forming multi-component oxide thin film layers within thin film fabrications such as thin film microelectronics fabrications and thin film sensor element fabrications include but are not limited to: (1) digital methods (which for the purposes of this application are defined as deposition methods where each reactant source material introduced into a reactor chamber within the deposition method is pulsed when forming a multi-component oxide thin film layer and at least one of the reactant source materials is pulsed without overlapping the pulses of the other reactant source materials); and (2) pulsed methods (which for the purposes of this application are defined as deposition methods where at least one reactant source material is introduced continuously into a reactor chamber within the deposition method employed in forming a multi-component oxide thin film layer while at least one other reactant source material is pulsed when introduced into the reactor chamber). Chemical vapor deposition (CVD) methods and related epitaxial deposition methods are of substantial interest when forming multi-component oxide thin film layers in such thin film applications due to: (1) the potential of those deposition methods for forming conformal multi-component oxide thin film layers with relative ease in comparison with alternative thin film deposition methods; and (2) the possibility of ready adaptation of chemical vapor deposition (CVD) methods and epitaxial deposition methods to continuous manufacturing processes.

While chemical vapor deposition (CVD) methods and related epitaxial deposition methods are thus desirable in the aforementioned thin film applications, chemical vapor deposition (CVD) methods and related epitaxial deposition methods are nonetheless not entirely without problems when forming multi-component oxide thin film layers in such applications. In particular, multi-component oxide thin film layers when formed within thin film microelectronics fabrications and thin film sensor element fabrications through chemical vapor deposition (CVD) methods and related epitaxial deposition methods often suffer from deficiencies including but not limited to: (1) compromised multi-component oxide thin film layer properties often related to attenuated multi-component oxide thin film layer crystallinity; (2) comparatively high deposition temperatures needed to form a multi-component oxide thin film layer with optimal properties; (3) attenuated precursor reactant source material incorporation efficiency within a multi-component oxide thin film layer; (4) significant reactant source material gas phase reactions when forming a multi-component oxide thin film layer; and/or (5) significant deposition reactor hardware costs associated with individually introducing individual reactant source materials into a deposition reactor chamber employed in forming a multi-component oxide thin film layer.

The present invention is therefore directed towards the goal of forming multi-component oxide thin film layers within fabrications such as but not limited to thin film microelectronics fabrications and thin film sensor element fabrications through chemical vapor deposition (CVD) methods and related epitaxial deposition methods, while avoiding the foregoing deficiencies.

Various oxide thin film layer deposition methods and materials have been disclosed within the art of oxide thin film layer deposition.

For example, Suntola et al., in U.S. Pat. No. 4,058,430 (Suntola I), and Suntola et al., in U.S. Pat. No. 4,413,022 (Suntola II), disclose various aspects of an atomic layer epitaxy (ALE) method which may be employed in forming simple (ie: single component) oxide thin film layers which may be employed within thin film microelectronics fabrications.

In addition: (1) Duray et al., in "Pulsed Organometallic Beam Epitaxy of Complex Oxide Films," Appl. Phys. Lett., Vol. 59 (12), Sept. 16, 1991, pp. 1503–05; (2) Hirai et al., in "Preparation of Tetragonal Perovskite Single Phase $PbTiO_3$ Film Using an Improved Metal-Organic Chemical Vapor Deposition Method Alternately Introducing Pb and Ti Precursors," Jpn. J. Appl. Phys., Vol. 32 (Pt.1, No. 9B), September 1993, pp. 4078–81 (Hirai I); (3) Xie et al., in "Epitaxial $LiTaO_3$ Thin Film by Pulsed Metalorganic Chemical Vapor Deposition From a Single Precursor," Appl. Phys. Lett., Vol. 63 (23) Dec. 6, 1993, pp. 3146–48; (4) Sotome et al., in "c-Axis-Oriented $Pb(Zr, Ti)O_3$ Thin Films Prepared by Digital Metalorganic Chemical Vapor Deposition Method," Jpn. J. Appl. Phys., Vol. 33 (Pt. 1, No. 7A), 1994, pp. 4066–69; (5) Hirai, in "Preparation of Perovskite Oriented $PbZr_xTi_{1-x}O_3$ Films With Suppressed Vapor Phase Reactions by a Digital Chemical Vapor Deposition Method," Jpn. J. Appl. Phys., Vol. 34 (Pt. 1, No. 2A), February. 1995, pp. 539–43; and (6) Buchholz et al., in "In-plane Orientation Control of (001) $YBa_2Cu_3O_{7-}$ Grown on (001) MgO by Pulsed Organometallic Beam Epitaxy," Appl. Phys. Lett., Vol. 68 (21), May 20, 1996, pp. 3037–39 (Hiral II), each disclose one of various pulsed or digital chemical vapor deposition (CVD) methods or epitaxial methods for forming multi-component oxide thin film layers which may be employed within thin film microelectronics fabrications or thin film sensor element fabrications.

Similarly: (1) McMillan et al., in U.S. Pat. No. 5,138,520; (2) Eres et al., in U.S. Pat. No. 5,164,040 (Eres I); (3) Eres et al., in U.S. Pat. No. 5,330,610 (Eres II); (4) Kelly, in U.S. Pat. No. 5,366,555; and (5) Versteeg et al., in U.S. Pat. No. 5,451,260 are each directed at least in part towards various apparatus configurations, along with associated chemical vapor deposition (CVD) methods and epitaxial deposition methods, which may be employed in forming oxide thin film layers within thin film microelectronics fabrications and thin film sensor element fabrications. Disclosed are: (1) a pulsed heating and irradiation apparatus and method (McMillan et al.); (2) a pulsed supersonic jet apparatus and method (Eres I); (3) an externally controlled closed-loop feedback apparatus and method (Eres II); (4) a segregated reaction region single chamber reactor apparatus and method (Kelly); and (5) an ultrasonic atomization liquid delivery apparatus and method (Versteeg et al.).

Finally, there is disclosed by Graf et al. In U.S. Pat. No. 5,439,876 and Bednorz et al., in U.S. Pat. No. 5,648,321 correlated atomic layer epitaxy (ALE) methods which may be employed for forming within thin film microelectronics fabrications lattice structured layers of materials which may include, but are not limited to, high critical temperature (Tc) thin film superconducting materials.

Desirable in the art of thin film fabrication are additional chemical vapor deposition (CVD) methods and related epitaxial deposition methods by which thin film fabrications such as but not limited to thin film microelectronics fabrications and thin film sensor element fabrications may have formed therein multi-component oxide thin film layers, where the methods are employed to form the multi-component oxide thin film layers with: (1) improved multi-component oxide thin film layer properties due to enhanced multi-component oxide thin film layer crystallinity; (2) improved multi-component oxide thin film layer properties, such as but not limited to uniformity and conformality (where for the purposes of this application conformality is defined as uniformity upon a structured surface) at comparatively lower chemical vapor deposition (CVD) substrate temperatures; (3) enhanced precursor reactant source material incorporation efficiency within the multi-component oxide thin film layers; (4) attenuated reactant source material gas phase reactions when forming the multi-component oxide thin film layers; and/or (5) reduced chemical vapor deposition (CVD) reactor hardware costs associated with individually introducing individual reactant source materials within chemical vapor deposition (CVD) reactor chambers within which are formed multi-component oxide thin film layers. It is towards the foregoing objects that the present invention is directed.

SUMMARY OF THE INVENTION

A first object of the present invention is to provide a chemical vapor deposition (CVD) method for forming a multi-component oxide thin film layer within a thin film fabrication.

A second object of the present invention is to provide a method in accord with the first object of the present invention, where the multi-component oxide thin film layer is formed with enhanced multi-component oxide thin film layer crystallinity within the multi-component oxide thin film layer, enhanced precursor reactant source material incorporation within the multi-component oxide thin film layer and enhanced uniformity and conformality of the multi-component oxide thin film layer, while forming the multi-component oxide thin film layer at a comparatively low chemical vapor deposition (CVD) substrate temperature.

A third object of the present invention is to provide a method in accord with the first object or the second object of the present invention, where the multi-component oxide thin film layer is formed with attenuated reactant source material gas phase reactions when forming the multi-component oxide thin film layer and reduced chemical vapor deposition (CVD) reactor hardware costs associated with individually introducing individual reactant source materials within a chemical vapor deposition (CVD) reactor chamber within which is formed the multi-component oxide thin film layer.

A fourth object of the present invention is to provide a method in accord with the first object of the present invention, the second object of the present invention or the third object of the present invention, where the thin film fabrication is a thin film microelectronics fabrication or a thin film sensor element fabrication.

A fifth object of the present invention is to provide a method in accord with the first object of the present invention, the second object of the present invention, the third object of the present invention or the fourth object of the present invention, which method is readily adapted to commercial thin film manufacturing operations.

In accord with the objects of the present invention, there is provided a chemical vapor deposition (CVD) method for forming a multi-component oxide layer over a substrate. In the method of the present invention, there is provided a chemical vapor deposition (CVD) reactor chamber, within which is positioned a substrate. A multi-component oxide precursor layer is formed over the substrate. The multi-component oxide precursor layer is formed from a multiplicity of precursor reactant source materials comprising at minimum a first precursor reactant source material and a second precursor reactant source material introduced simultaneously into the chemical vapor deposition (CVD) reactor chamber in absence of an oxidant reactant source material. The multi-component oxide precursor layer formed over the substrate is oxidized with the oxidant reactant source material within the chemical vapor deposition (CVD) reactor chamber to form a multi-component oxide layer formed over the substrate. The oxidant reactant source material is introduced into the chemical vapor deposition (CVD) reactor chamber in absence of the first precursor reactant source material and the second precursor reactant source material.

The present invention provides a chemical vapor deposition (CVD) method for forming a multi-component oxide thin film layer over a substrate, such as but not limited to a substrate employed within a thin film microelectronics fabrication or a thin film sensor element fabrication, where: (1) the multi-component oxide thin film layer is formed with enhanced crystallinity within the multi-component oxide thin film layer, enhanced precursor reactant source material incorporation efficiency within the multi-component oxide thin film layer and enhanced uniformity and conformality of the multi-component oxide thin film layer, while forming the multi-component oxide thin film layer at a comparatively low chemical vapor deposition (CVD) substrate temperature; and (2) the multi-component oxide thin film layer is formed with attenuated reactant source material gas phase reactions when forming the multi-component oxide thin film layer and reduced chemical vapor deposition (CVD) reactor hardware costs associated with individually introducing individual reactant source materials within a chemical vapor deposition (CVD) reactor chamber within which is formed the multi-component oxide thin film layer. The method of the present invention realizes the foregoing objects by forming a multi-component oxide thin film layer with a digital chemical vapor deposition (CVD) method, wherein there is first formed a multi-component oxide precursor layer over a substrate, where the multi-component oxide precursor layer is formed through simultaneous introduction of at minimum a first precursor reactant source material and a second precursor reactant source material into a chemical vapor deposition (CVD) reactor chamber in absence of an oxidant reactant source material. The multi-component oxide precursor layer is then oxidized with the oxidant reactant source material in absence of the first precursor reactant source material and the second precursor reactant source material.

The method of the present invention may be employed where the thin film fabrication is a thin film microelectronics fabrication or a thin film sensor element fabrication. The method of the present invention may be utilized with any suitable thin film fabrication within which a multi-component oxide thin film layer is formed. Thus, the method of the present invention may be employed in forming a multi-component oxide thin film layer within a thin film fabrication chosen from the group of thin film fabrications including but not limited to thin film microelectronics fabrications and thin film sensor element fabrications, as well as other thin film fabrications such as but not limited to thin film high critical temperature (Tc) superconducting materials fabrications.

The method of the present invention is readily adapted to commercial thin film manufacturing operations. The method of the present invention employs chemical vapor deposition (CVD) methods, materials and apparatus which are otherwise generally known in the art of chemical vapor deposition (CVD) of thin film layers over substrates. Since the method of the present invention is directed towards a novel and more efficient use of such chemical vapor deposition (CVD) methods, materials and apparatus, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a chemical vapor deposition (CVD) method for forming a multi-component oxide thin film layer over a substrate, such as but not limited to a substrate employed within a thin film microelectronics fabrication or a thin film sensor element fabrication, where the multi-component oxide thin film layer is formed with, amongst other properties, an enhanced crystallinity within the multi-component oxide thin film layer, an enhanced precursor reactant source material incorporation efficiency within the multi-component oxide thin film layer and an enhanced uniformity or conformality of the multi-component oxide thin film layer, at a comparatively low chemical vapor deposition (CVD) substrate temperature. The method of the present invention realizes the foregoing objects by employing when forming a multi-component oxide thin film layer in accord with the present invention a digital chemical vapor deposition (CVD) method through which is first formed a multi-component oxide precursor layer over the substrate, where the multi-component oxide precursor layer is formed through simultaneous introduction of at minimum a first precursor reactant source material and a second precursor reactant source material into a chemical vapor deposition (CVD) reactor chamber in absence of an oxidant reactant source material. The multi-component oxide precursor layer is then oxidized within the chemical vapor deposition (CVD) reactor chamber with the oxidant reactant source material in absence of the first precursor reactant source material and the second precursor reactant source material.

The method of the present invention may be employed in forming multi-component oxide thin film layers over substrates employed within thin film fabrications including but not limited to thin film microelectronics fabrications (such as but not limited to integrated circuit thin film microelectronics fabrications, solar cell thin film microelectronics fabrications, ceramic substrate thin film microelectronics fabrications and flat panel display thin film microelectronics fabrications) and thin film sensor element fabrications (such as but not limited to piezoelectric thin film sensor element fabrications, pyroelectric thin film sensor element fabrications, magnetoresistive (MR) thin film sensor element fabrications and chemical gas detector thin film sensor element fabrications).

Figure 1:
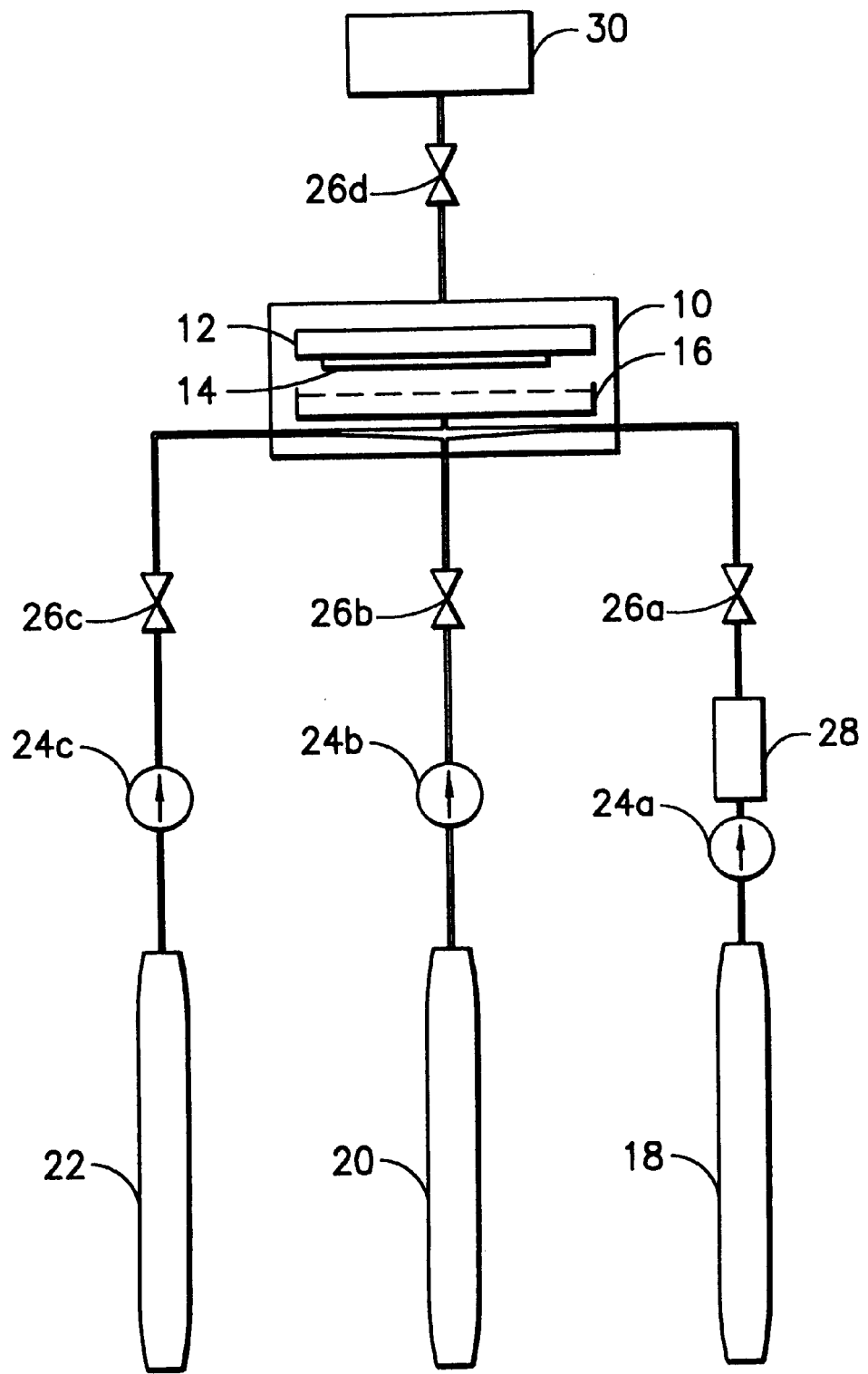
FIG. 1 shows a schematic diagram of a chemical vapor deposition (CVD) apparatus which may be employed in practice of the method of the present invention.

Referring now to FIG. 1, there is shown a schematic diagram of a chemical vapor deposition (CVD) apparatus within which may be formed a multi-component oxide thin film layer in accord with the method of the present invention. Shown in FIG. 1 is a chemical vapor deposition (CVD) reactor chamber 10 within which there is fixed a platen 12 having positioned thereupon a substrate 14. Within the method of the present invention, the chemical vapor deposition (CVD) reactor chamber 10 and the platen 12 are otherwise conventional in the art of chemical vapor deposition (CVD) methods, but sized appropriately to accommodate the substrate 14. As noted above, the substrate 14 may be a substrate employed within a thin film fabrication including but not limited to a thin film microelectronics fabrication or a thin film sensor element fabrication.

Although the method of the present invention has particular utility in forming high dielectric constant, or ferroelectric, multi-component oxide thin film dielectric layers, such as but not limited to barium strontium titanate (BST) dielectric layers and lead zirconium titanate (PZT) dielectric layers, within advanced integrated circuit thin film microelectronics fabrications such as but not limited to advanced dynamic random access memory (DRAM) integrated circuit thin film microelectronics fabrications, there are many multi-component oxide thin film layers which may be formed through the method of the present invention.

In general, the nature of a thin film fabrication into which the substrate 14 is fabricated after the substrate 14 has had a multi-component oxide thin film layer formed over it through the method of the present invention will at least in part dictate the nature of a multi-component oxide thin film layer to be formed over the substrate 14. Thus, the method of the present invention may be employed in forming over the substrate 14 multi-component oxide thin film layers including but not limited to barium strontium titanate (BST) multi-component oxide thin film layers, bismuth titanate (BT) multi-component oxide thin film layers, lead zirconium titanate (PZT) multi-component oxide thin film layers, strontium bismuth tantalate (SBT) multi-component oxide thin film layers, strontium bismuth niobate tantalate (SBNT) multi-component oxide thin film layers, calcium, strontium and/or barium doped lanthanum manganese oxide (LMO) based multi-component oxide thin film layers, yttrium barium copper oxide (YBCO) multi-component oxide thin film layers, and bismuth strontium calcium copper oxide (BSCCO) multi-component oxide thin film layers.

There is also shown in FIG. 1 within the chemical vapor deposition (CVD) reactor chamber 10 a nozzle 16 through which is supplied reactant source materials to the chemical vapor deposition (CVD) reactor chamber 10 in accord with the method of the present invention. Similarly, there is also shown in FIG. 1 connected to the chemical vapor deposition (CVD) reactor chamber 10 a vacuum pump 30 which is employed to evacuate spent reactant source materials from the chemical vapor deposition (CVD) reactor chamber 10, where a spent reactant source material flow may be controlled through use of a chemical vapor deposition (CVD) reactor chamber 10 throttle valve 26d.

Finally, there is shown within FIG. 1 connected to and supplying the nozzle 16: (1) a precursor reactant source materials source 18 from which a precursor reactant source materials flow is monitored through a precursor reactant source materials flow meter 24a and controlled through a precursor reactant source materials control valve 26a; (2) an inert purge gas source 20 from which an inert purge gas flow is monitored through an inert purge gas flow meter 24b and controlled through an inert purge gas control valve 26b; and (3) an oxidant reactant source material source 22 from which an oxidant reactant source material flow is monitored through an oxidant reactant source material flow meter 24c and controlled through an oxidant reactant source material control valve 26c. Similarly, there is shown in FIG. 1 an optional flash evaporator 28 to be employed when the precursor reactant source materials within the precursor reactant source materials source 18 are in a liquid form which is desired to be vaporized prior to introduction into the chemical vapor deposition (CVD) reactor chamber 10 through the nozzle 16.

Within the preferred embodiment of the present invention, the precursor reactant source materials source 18 supplies, at minimum, a first precursor reactant source material and a second precursor reactant source material simultaneously to the nozzle 16, and thus to the chemical vapor deposition reactor chamber 10. More preferably, the precursor reactant source materials source 18 simultaneously supplies to the nozzle 16 all of the precursor reactant source materials employed in forming a multi-component oxide layer over the substrate 14 within the chemical vapor deposition (CVD) reactor chamber 10 through the digital chemical vapor deposition (CVD) method of the present invention. As noted from the above listing of multi-component oxide layers which may be formed through the method of the present invention, the number of precursor reactant source materials which might thus more preferably be supplied simultaneously to the nozzle 16 from the precursor reactant source materials source 18 may readily be 3, 4, 5 or more precursor reactant source materials.

Within the preferred embodiment of the present invention, the precursor reactant source materials may be contained within the precursor reactant source materials source 18 as a mixture of solids, liquids, gases or vapors which do not react substantially to compromise their identity or transport to the nozzle 16 and the chemical vapor deposition (CVD) reactor chamber 10 as individual precursor reactant source materials. Preferably, the precursor reactant source materials within the precursor reactant source materials source 18 are in solution. More preferably, the precursor reactant source materials within the precursor reactant source materials source 18 are chemically coordinated precursor reactant source materials which provide at minimum a chemically coordinated first precursor reactant source material and a chemically coordinated second precursor reactant source material of sufficient chemical stability and volatility such that their transport to the nozzle 16 and the chemical vapor deposition (CVD) reactor chamber 10 as individual precursor reactant source materials is not compromised. Within the preferred embodiment of the present invention, at least the first precursor reactant source material and the second precursor reactant source material may also be introduced into the chemical vapor deposition (CVD) reactor chamber 10 in conjunction with an inert carrier gas, such as but not limited to helium, neon, argon, xenon or mixtures thereof, in order to secure process optimization.

A general, but not exclusive, group of chemically coordinated precursor reactant source materials which may be employed as precursor reactant source materials in accord with the method of the present invention is disclosed within related co-assigned U.S. Pat. No. 5,453,494 to Kirlin et al., the teachings of which are incorporated herein fully by reference. Other potential precursor reactant source materials which may be employed within the method of the present invention are suitable metal oxide precursor materials which are otherwise desirable within conventional continuous chemical vapor deposition (CVD) methods, but undergo facile and undesirable gas phase oxidation reactions with oxidant reactant source materials employed within the method of the present invention.

Similarly, within the preferred embodiment of the present invention, the inert purge gas supplied to the chemical vapor deposition (CVD) reactor chamber 10 from the inert purge gas source 20 may be selected from the group of inert purge gases including but not limited to helium, neon, argon, xenon and mixtures thereof.

Finally, within the preferred embodiment of the present invention, the oxidant reactant source material supplied to the chemical vapor deposition (CVD) reactor chamber 10 from the oxidant reactant source material source 22 may be selected from the group of oxidant reactant source materials consisting of oxygen, ozone, nitrous oxide, nitric oxide, nitrogen dioxide, water vapor, hydrogen peroxide vapor and mixtures thereof, along with suitable non-reactive diluent gases, in order to secure process optimization. The oxidant reactant source material may be additionally activated through means such as but not limited to plasma activation means, UV light activation means, laser activation means, ion activation means, and/or electron activation means.

Figure 2:
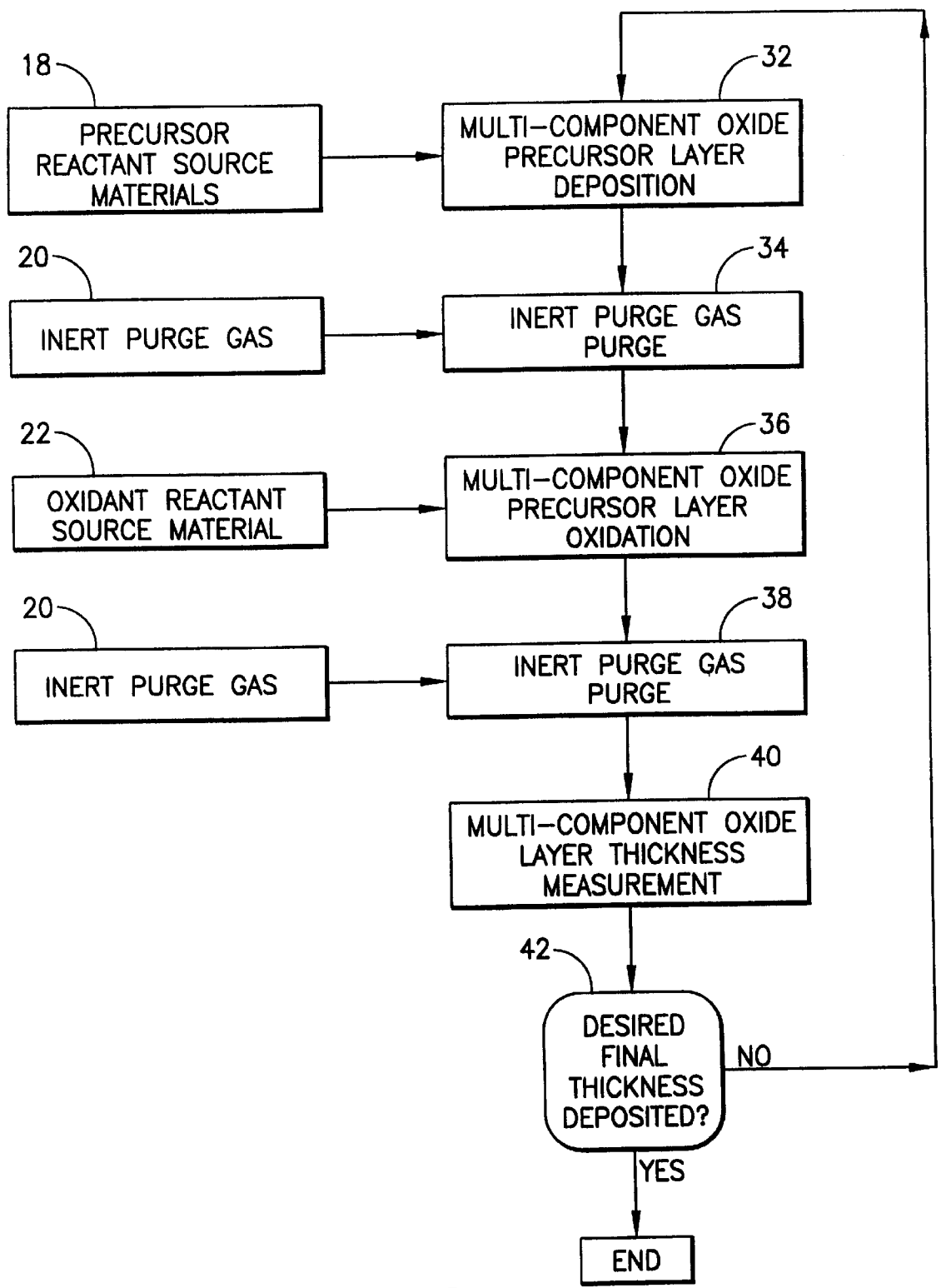
FIG. 2 shows a schematic process flow diagram of the method of the present invention.

Referring now to FIG. 2, there is shown a schematic process flow diagram illustrating the pertinent process steps through which is formed a multi-component oxide thin film layer in accord with the method of the present invention, while employing the chemical vapor deposition (CVD) apparatus whose schematic cross-sectional diagram is illustrated in FIG. 1.

As is illustrated within FIG. 2, within a first process step 32 there is deposited a multi-component oxide precursor layer over the substrate 14, while employing the precursor reactant source materials obtained from the precursor reactant source materials source 18, where the precursor reactant source materials include at minimum the first precursor reactant source material and the second precursor reactant source material. Within the preferred embodiment of the present invention at least the first precursor reactant source material and the second precursor reactant source material are simultaneously introduced into the chemical vapor deposition (CVD) reactor chamber 10 in absence of the oxidant reactant source material to form the multi-component oxide precursor layer over the substrate 14. Typically and preferably, the multi-component oxide precursor layer is formed over the substrate 14 to a thickness of from about 5 to about 100 Angstroms employing an appropriate precursor reactant source materials flow rate.

Next, within a second process step 34 as illustrated within the schematic process flow diagram of FIG. 2, the chemical vapor deposition (CVD) reactor chamber 10 is purged employing the inert purge gas from the inert purge gas source 20. For the method of the present invention, the chemical vapor deposition reactor chamber 10 is preferably purged with an argon purge gas, preferably at an inert purge gas flow rate which will efficiently purge at minimum the first precursor reactant source material and the second precursor reactant source material from the chemical vapor deposition (CVD) reactor chamber 10. Typically and preferably, such a purge rate will be in the range of from about 50 to about 2000 standard cubic centimeters per minute (sccm).

Next, within a third process step 36 as illustrated within the schematic process flow diagram of FIG. 2, the multi-component oxide precursor layer is oxidized, while employing the oxidant reactant source material obtained from the oxidant reactant source material source 22, to form a multi-component oxide layer from the multi-component oxide precursor layer. Within the method of the present invention, the oxidant reactant source material is supplied to the chemical vapor deposition (CVD) reactor chamber 10 at a flow rate appropriate to the chemical vapor deposition (CVD) reactor chamber 10 and multi-component oxide precursor layer. Typically and preferably, the oxidant reactant source material is supplied at a flow rate of from about 50 to about 2000 standard cubic centimeters per minute (sccm).

Next, within a fourth process step 38 as illustrated within the schematic process flow diagram of FIG. 2, the chemical vapor deposition (CVD) reactor chamber 10 is purged for a second time, while employing the inert purge gas from the inert purge gas source 20. For the method of the present invention, the chemical vapor deposition reactor chamber 10 is preferably purged for the second time with the argon purge gas, preferably also at a second inert purge gas flow rate which will efficiently purge the oxidant reactant source material from the chemical vapor deposition (CVD) reactor chamber 10. Typically and preferably, such a second purge rate will also be in the range of from about 50 to about 2000 standard cubic centimeters per minute (sccm).

Next, within a fifth process step 40 as illustrated within the schematic process flow diagram of FIG. 2, the multi-component oxide layer thickness is measured in-situ. Such measurement is typically and preferably undertaken through optical interferometric measurement methods or x-ray fluorescence methods as are conventional in the art of thin film measurement. If a desired final thickness of the multi-component oxide layer has not been deposited, as illustrated within the decisional process step 42 within the schematic process flow diagram of FIG. 2, the series of process steps 32, 34, 36, 38 and 40 (which in the aggregate form a process cycle) is repeated. If the desired final thickness of the multi-component oxide layer is deposited, processing of the substrate 14 in accord with the method of the present invention is ended and the substrate 14 may then be removed from the chemical vapor deposition (CVD) reactor chamber 10 for appropriate further fabrication. Within the preferred embodiment of the present invention there is typically and preferably employed a multiplicity of process cycles in forming a multi-component oxide layer, where the multiplicity of process cycles typically has a range of from about 5 to about 1000 cycles and forms a multi-component oxide layer of thickness from about 20 to about 20000 Angstroms, more preferably from about 50 to about 2000 Angstroms. Under such circumstances, there is assured an optimal oxidation of a multi-component oxide precursor layer when forming the multi-component oxide layer.

Although not specifically illustrated within the schematic process flow diagram of FIG. 2 or the schematic diagram of the chemical vapor deposition (CVD) reactor apparatus as illustrated within FIG. 1, there is typically employed within the preferred embodiment of the present invention when forming a multi-component oxide layer: (1) a chemical vapor deposition (CVD) reactor chamber 10 pressure of from about 0.02 to about 10 torr; and (2) a substrate 14 temperature, which will vary depending upon the nature of a multi-component oxide layer desired to be deposited upon the substrate 14, of from about 400 to about 800 degrees Centigrade.

Similarly, although also not specifically illustrated within the schematic process flow diagram of FIG. 2 or the schematic diagram of the chemical vapor deposition (CVD) reactor apparatus as illustrated in FIG. 1, there may also be employed within the method of the present invention within the deposition of the multi-component oxide precursor layer or the oxidation of the multi-component oxide precursor layer to form the multi-component oxide layer additional activation means beyond thermal activation means. Such additional activation means may include, but are not limited to plasma activation, UV light activation, laser activation, ion activation and/or electron activation.

Figure 3:
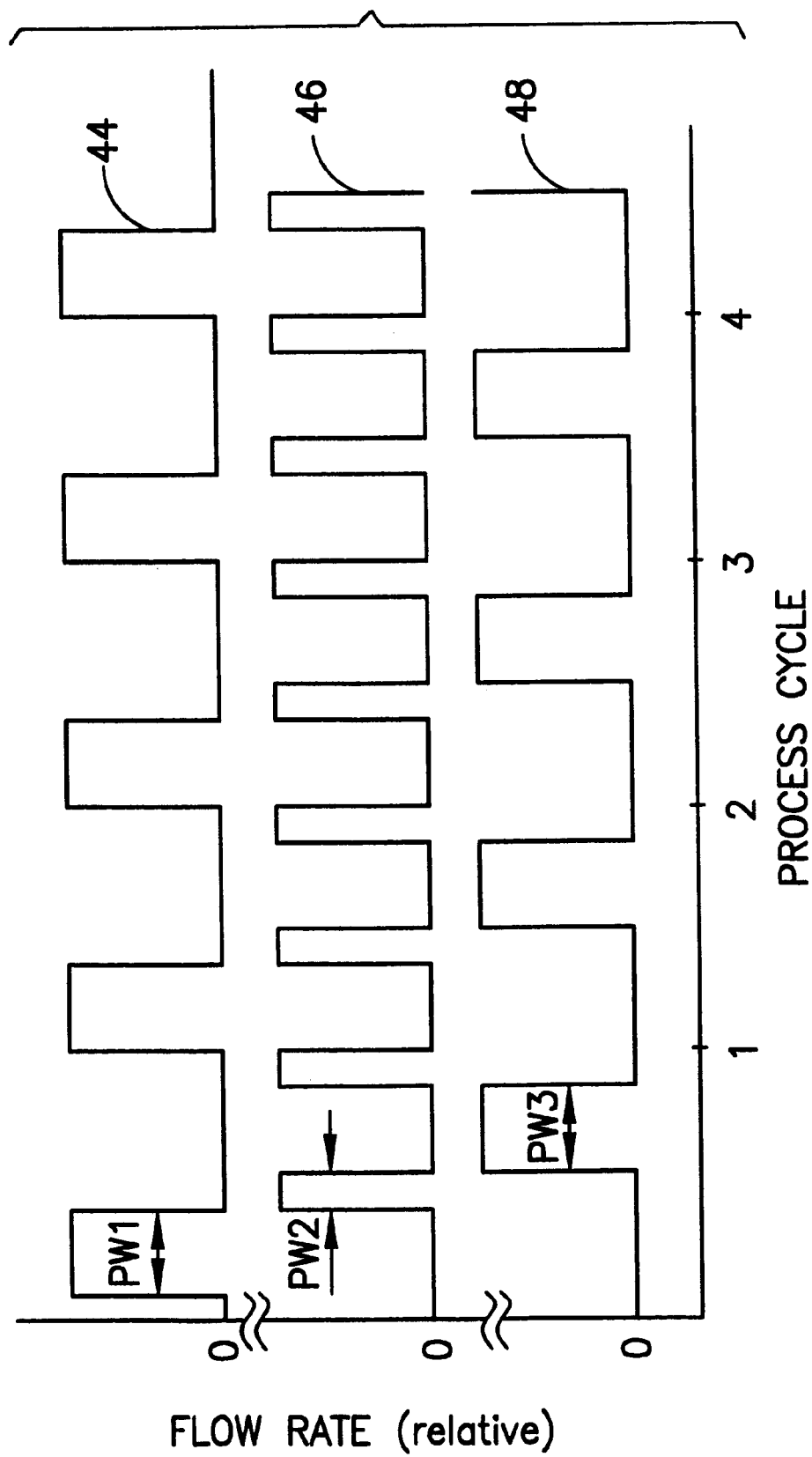
FIG. 3 shows a graph of flow rate versus process cycle for a precursor reactant source materials flow, an inert purge gas flow and an oxidant reactant source material flow in accord with the method of the present invention.
Figure 4A:
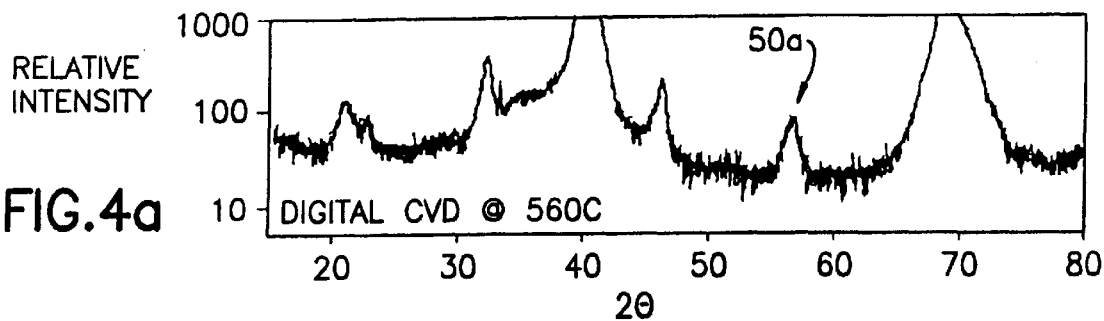
FIG. 4a, FIG. 4b and FIG. 4c show a series of x-ray crystallographic scans as a function of deposition temperature illustrating enhanced crystallinity within a barium strontium titanate (BST) layer when forming the barium strontium titanate (BST) layer in accord with an example of the present invention.
Figure 4B:
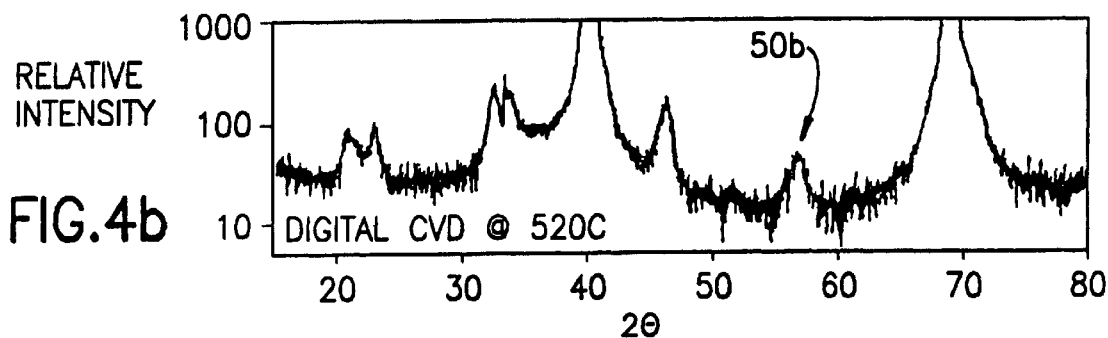
Figure 4C:
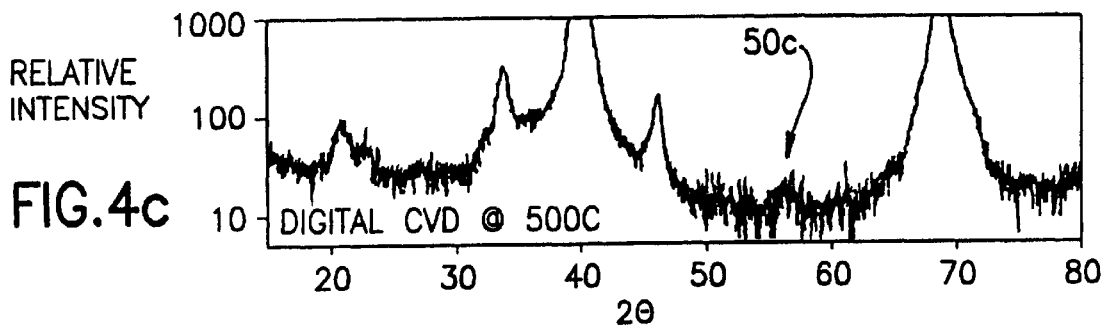
Figure 4D:
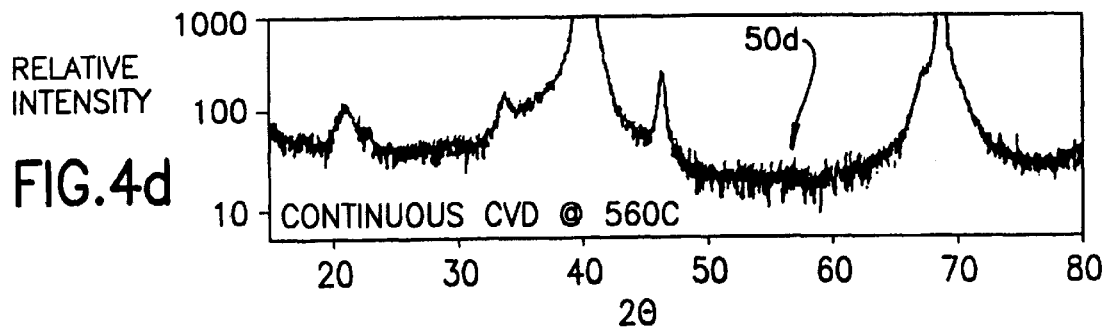
FIG. 4d shows an x-ray crystallographic scan illustrating attenuated crystallinity within a barium strontium titanate (BST) layer when forming the barium strontium titanate (BST) layer in accord with a continuous chemical vapor deposition (CVD) method generally conventional in the art of multi-component oxide thin film layer deposition.

Referring now to FIG. 3, there is shown a graph illustrating precursor reactant source materials flow rates, inert purge gas flow rates and oxidant reactant source material flow rates as a function of process cycle, corresponding with the schematic process flow diagram of FIG. 2. Illustrated in FIG. 2 is a pulsed precursor reactant source materials flow rate curve 44, a pulsed inert purge gas flow rate curve 46 and a pulsed oxidant reactant source material flow rate curve 48. Within the method of the present invention, the pulsed precursor reactant source materials flow rate curve 44 typically and preferably has a precursor reactant source materials pulse width PW 1 of from about 2 to about 60 seconds, while the pulsed inert purge gas flow rate curve 46 typically and preferably has an inert purge gas pulse width PW2 of from about 0.5 to about 30 seconds and the pulsed oxidant reactant source material flow rate curve 48 typically and preferably has an oxidant reactant source material pulse width PW3 of from about 1 to about 60 seconds. Thus, typically and preferably, the aggregate of a single precursor reactant source materials pulse width PW1 plus a single oxidant reactant source material pulse width PW3 plus two times an inert purge gas pulse width PW2 provides a cycle time as illustrated in FIG. 3 of from about 4 to about 180 seconds.

As will be seen in accord with the examples which follow, multi-component oxide thin film layers formed in accord with the method of the present invention are formed with enhanced crystallinity, enhanced precursor reactant source material incorporation efficiency, and enhanced uniformity, at lower substrate temperatures in comparison with continuous chemical vapor deposition (CVD) methods as are otherwise generally known in the art of thin film deposition. Similarly, since the method of the present invention employs a pulsing of an oxidant reactant source material independent of a pulsing of a group of precursor reactant source materials (along with precursor reactant source materials which are not susceptible to gas phase reactions among themselves), there is attenuated gas phase reactions within reactant source materials when forming a multi-component oxide thin film layer in accord with the method of the present invention. Finally, since the method of the present invention introduces simultaneously into a chemical vapor deposition (CVD) reactor chamber at minimum a first precursor reactant source material and a second precursor reactant source material, chemical vapor deposition (CVD) reactor costs associated with introducing the first precursor reactant source material and the second precursor reactant source material into the chemical vapor deposition (CVD) reactor chamber may be reduced.

EXAMPLES 1-2

In order to evaluate the precursor reactant source material incorporation efficiency when forming a barium strontium titanate (BST) multi-component oxide layer through the method of the present invention, there was prepared two series of substrates. The two series of substrates were formed from (100) silicon semiconductor substrates each having formed thereupon a tantalum adhesion layer of thickness about 500 Angstroms deposited through a physical vapor deposition (PVD) method, the tantalum adhesion layer in turn having formed thereupon a platinum layer of thickness about 4000 Angstroms also deposited through a physical vapor deposition (PVD) method.

Upon each substrate within the first series of substrates was formed a barium strontium titanate (BST) multi-component oxide layer through a digital chemical vapor deposition (CVD) method in accord with the preferred embodiment of the present invention. The digital chemical vapor deposition (CVD) method employed: (1) a reactor chamber pressure of about 0.500 torr; (2) a substrate temperature of about 560 degrees Centigrade; (3) a precursor reactant source material mixture comprising the N, N, N', N", N"-pentamethyldiethylenetriamine complexed adducts of: (a) barium bis (2,2,6,6-tetramethyl-3,5-heptanedionate); and (b) strontium bis (2,2,6,6-tetramethyl-3,5-heptanedionate); along with (c) titanium bis (isopropoxide) bis (2,2,6,6-tetramethyl-3,5-heptanedionate) in a 1:1:1.86 molar ratio in an n-butyl acetate/N, N, N', N", N"-pentamethyldiethylenetriamine solvent mixture at a total molarity of about 0.568 moles per liter; (4) a precursor reactant source materials flow rate of about 0.08 milliliters per minute into a flash evaporator at 230 degrees Centigrade and an argon flash carrier gas flow rate of about 200 standard cubic centimeters per minute (sccm) for a digital precursor reactant source materials pulse width of about 14 seconds; (5) an argon inert purge gas flow rate of about 1000 standard cubic centimeters per minute (sccm) for a digital argon inert purge gas pulse width of about 3 seconds; and (6) an oxygen:nitrous oxide (1:1, vol:vol) oxidant reactant source material flow rate of about 1000 standard cubic centimeters per minute (sccm) for a digital oxygen:nitrous oxide oxidant reactant source material pulse width of about 14 seconds.

Within the above digital chemical vapor deposition (CVD) method, it is believed that the tetraglyme complexed adducts of barium bis (2,2,6,6-tetramethyl-3,5-heptanedionate) and strontium bis (2,2,6,6-tetramethyl-3,5-heptanedionate) may be substituted for the N, N, N', N", N"-pentamethyldiethylenetriamine complexed adducts of barium bis (2,2,6,6-tetramethyl-3,5-heptanedionate) and strontium bis (2,2,6,6-tetramethyl-3,5-heptanedionate), with equivalent results, provided that the n-butyl acetate/N, N, N', N", N"-pentamethyldiethylenetriamine solvent mixture is substituted with a corresponding n-butyl acetate/tetraglyme solvent mixture.

Similarly, as is also understood by a person skilled in the art, the mass flow controllers typically employed in controlling the precursor reactant source materials flash carrier gas flow, the inert purge gas flow and the oxidant reactant source material flow to the chemical vapor deposition (CVD) reactor chamber in accord with the foregoing digital chemical vapor deposition (CVD) method are known in the art to produce upon actuation a burst of precursor reactant source materials flash carrier gas flow, inert purge gas flow or oxidant reactant source material flow which leads to a transient pressure rise and corresponding increased initial precursor reactant source materials concentration, increased initial inert purge gas concentration or increased initial oxidant reactant source material concentration within the chemical vapor deposition (CVD) reactor chamber. The consequences of these increased initial concentrations, particularly as regards the oxidant reactant source material concentration, have not been investigated.

The barium strontium titanate (BST) layers were formed upon the first series of substrates employing the foregoing conditions for a total of 100 cycles, which provided barium strontium titanate (BST) layers of total thicknesses about 3300 Angstroms.

For comparison purposes, a second series of barium strontium titanate (BST) layers was formed upon the second series of substrates under deposition conditions otherwise equivalent to the deposition conditions employed within the first series barium strontium titanate (BST) layers, but wherein the precursor reactant source materials and the oxidant reactant source materials were introduced into the chemical vapor deposition (CVD) reactor chamber simultaneously and without separation by a series of argon inert purge gas purge pulses. The second series of barium strontium titanate (BST) layers was formed for continuous deposition times of about 1200 seconds.

There was then measured for all of the substrates: (1) the thicknesses of the barium strontium titanate (BST) layers through an x-ray fluorescence method as is conventional in the art of thin film measurement; and (2) the dielectric constants of the barium strontium titanate (BST) layers through an electrical test method as is similarly conventional in the art of thin film electrical measurement. The results of the measurements are reported in Table I, where the barium strontium titanate (BST) multi-component oxide thin film layer growth rates upon the first series of substrates are normalized to either: (1) aggregate precursor reactant source materials pulse time only; (2) aggregate precursor reactant source materials pulse time plus aggregate oxidant reactant source material pulse time; or (3) aggregate precursor reactant source materials pulse time plus aggregate oxidant reactant source material pulse time plus aggregate inert purge gas pulse time, which in the aggregate equals total chemical vapor deposition (CVD) run time.

TABLE I

| Example | BST Dep. Method | BST Growth Rate (A/second) | Dielect. Const. |
|---|---|---|---|
| 1 | Digital CVD | 2.01 +/– 0.5% (vs precursor only)<br>1.34 +/– 0.5% (vs precursor. & oxidant)<br>1.04 +/– 0.5% (vs total run time) | 231 |
| 2 | Continuous CVD | 0.60 +/– 10% | shorted |

As is seen from review of the data in Table I, the barium strontium titanate (BST) multi-component oxide thin film layers formed through a digital chemical vapor deposition (CVD) method in accord with the preferred embodiment of the present invention are formed with enhanced growth rates, and thus correlating enhanced precursor source materials incorporation efficiencies, in comparison with barium strontium titanate (BST) multi-component oxide thin film layers formed through a continuous chemical vapor deposition (CVD) method. Similarly, as is also seen from review of the data in Table I, the barium strontium titanate (BST) multi-component oxide thin film layers formed through the digital chemical vapor deposition method in accord with the preferred embodiment of the present invention are also formed with enhanced dielectric layer properties in comparison with barium strontium titanate (BST) multi-component oxide thin film layers formed through the continuous chemical vapor deposition (CVD) method. Similarly, as is finally shown from review of the data within Table I, barium strontium titanate (BST) multi-component oxide thin film layers formed through the digital chemical vapor deposition (CVD) method in accord with the preferred embodiment of the present invention are also formed with enhanced thickness uniformity, and thus conformality, in comparison with barium strontium titanate (BST) multi-component oxide thin film layers formed through the continuous chemical vapor deposition (CVD) method.

EXAMPLES 3-4

Two additional barium strontium titanate (BST) layers were formed in accord with the method employed in forming the barium strontium titanate (BST) layer of example 1, but wherein the chemical vapor deposition (CVD) substrate temperature was maintained at either 520 degrees Centigrade or 500 degrees Centigrade, rather than the chemical vapor deposition substrate temperature of 560 degrees Centigrade employed within example 1. There was then obtained an x-ray crystallographic scan of each of the barium strontium titanate (BST) layers formed within example 1, example 2 and these two additional examples. The resulting x-ray crystallographic diffraction scans are shown in FIG. 4a to FIG. 4d, where: (1) FIG. 4a corresponds with the x-ray crystallographic diffraction scan for the barium strontium titanate (BST) layer formed through the digital chemical vapor deposition (CVD) method at 560 degrees Centigrade substrate temperature; (2) FIG. 4b corresponds with the x-ray crystallographic diffraction scan for the barium strontium titanate (BST) layer formed through the digital chemical vapor deposition (CVD) method at 520 degrees Centigrade substrate temperature; (3) FIG. 4c corresponds with the x-ray crystallographic diffraction scan for the barium strontium titanate (BST) layer formed through the digital chemical vapor deposition (CVD) method at 500 degrees Centigrade substrate temperature; and (4) FIG. 4d corresponds with the x-ray crystallographic diffraction scan for the barium strontium titanate (BST) layer formed through the conventional continuous chemical vapor deposition (CVD) method at 560 degrees Centigrade substrate temperature.

As is seen by comparison of FIG. 4a, FIG. 4b, FIG. 4c and FIG. 4d, a corresponding series of crystalline barium strontium titanate (BST) diffraction peaks $50a$, $50b$, $50c$ and $50d$ at a 2 diffraction angle equal to about 57 degrees decreases in intensity when the digital chemical vapor deposition (CVD) substrate temperature decreases from about 560 degrees Centigrade to about 500 degrees Centigrade and is minimally, if at all, discernibly present within the x-ray diffraction crystallographic scan for the barium strontium titanate (BST) layer formed through the continuous chemical vapor deposition (CVD) method at 560 degrees Centigrade substrate temperature. Thus, there is formed through the digital chemical vapor deposition (CVD) method of the present invention multi-component oxide thin film layers, such as but not limited to barium strontium titanate (BST) multi-component oxide thin layers, with enhanced crystallinity at lower substrate temperatures, in comparison with multi-component oxide thin film layers formed through continuous chemical vapor deposition (CVD) methods.

As is understood by a person skilled in the art, the preferred embodiment and examples of the present invention are illustrative of the present invention rather than limiting of the present invention. Revisions and modifications may be made to methods, materials, structures and dimensions through which are formed multi-component oxide thin film layers in accord with the preferred embodiment and examples of the present invention, while still providing multi-component oxide thin film layers formed in accord with the present invention, as defined by the appended claims.

What is claimed is:

1. A digital chemical vapor deposition (CVD) method for forming a multi-component oxide layer comprising:

(i) providing a chemical vapor deposition (CVD) reactor chamber;

(ii) positioning within the chemical vapor deposition (CVD) reactor chamber a substrate;

(iii) forming over the substrate a multi-component oxide precursor layer, the multi-component oxide precursor layer being formed from a multiplicity of precursor reactant source materials comprising at minimum a first precursor reactant source material and a second precursor reactant source material introduced simultaneously into the chemical vapor deposition (CVD)

reactor chamber in absence of an oxidant reactant source material; and (iv) oxidizing with the oxidant reactant source material within the chemical vapor deposition (CVD) reactor chamber the multi-component oxide precursor layer formed over the substrate to form the multi-component oxide layer over the substrate, the oxidant reactant source material being introduced into the chemical vapor deposition (CVD) reactor chamber in absence of the first precursor reactant source material and the second precursor reactant source material.

2. The method of claim 1 wherein the multi-component oxide layer is formed with an enhanced precursor reactant source material incorporation efficiency of the multiplicity of precursor reactant source materials in comparison with a second multi-component oxide layer formed employing conditions equivalent to the conditions employed in forming the multi-component oxide layer, but with simultaneous introduction into the chemical vapor deposition (CVD) reactor chamber of the first precursor reactant source material, the second precursor reactant source material and the oxidant reactant source material.

3. The method of claim 1 wherein the multi-component oxide layer is formed with an enhanced crystallinity at a lower substrate temperature in comparison with a second multi-component oxide layer formed employing conditions equivalent to the conditions employed in forming the multi-component oxide layer, but with simultaneous introduction into the chemical vapor deposition (CVD) reactor chamber of the first precursor reactant source material, the second precursor reactant source material and the oxidant reactant source material.

4. The method of claim 1 wherein the multi-component oxide layer is selected from the group consisting of barium strontium titanate (BST) layers, bismuth titanate (BT) layers, lead zirconium titanate (PZT) layers, strontium bismuth tantalate (SBT) layers, strontium bismuth niobate tantalate (SBNT), doped lanthanum manganese oxide (LMO) layers, yttrium barium copper oxide (YBCO) layers, and bismuth strontium calcium copper oxide (BSCCO) layers.

5. The method of claim 1 wherein the substrate is employed within a fabrication selected from the group consisting of microelectronics fabrications and sensor fabrications.

6. The method of claim 5 wherein the microelectronics fabrications are selected from the group consisting of integrated circuit microelectronics fabrications, solar cell microelectronics fabrications, ceramic substrate microelectronics fabrications and flat panel display microelectronics fabrications.

7. The method of claim 5 wherein the sensor fabrications are selected from the group consisting of piezoelectric sensor fabrications, pyroelectric sensor fabrications, magnetoresistive (MR) sensor fabrications and chemical gas detector sensor fabrications.

8. The method of claim 1 wherein at minimum the first precursor reactant source material and the second precursor reactant source material are introduced into the chemical vapor deposition (CVD) reactor chamber through a liquid source delivery method.

9. The method of claim 8 wherein the liquid source delivery method employs at minimum a coordinated first precursor reactant source material and a coordinated second precursor reactant source material each of sufficient stability to attenuate a reaction of the coordinated first precursor reactant source material and the coordinated second precursor reactant source material when introducing the coordinated first precursor reactant source material and the coordinated second precursor reactant source material into the chemical vapor deposition (CVD) reactor chamber through the liquid source delivery method.

10. The method of claim 1 wherein the oxidant reactant source material is selected from the group consisting of oxygen, ozone, nitrous oxide, nitric oxide, nitrogen dioxide, water vapor, hydrogen peroxide vapor, mixtures thereof, plasma activated derivatives thereof, UV light activated derivatives thereof, laser activated derivatives thereof, ion activated derivatives thereof, and electron activated derivatives thereof.

11. The method of claim 1 further comprising purging of at minimum the first precursor reactant source material and the second precursor reactant source material from the chemical vapor deposition (CVD) reactor chamber intervening step (iii) and step (iv).

12. A digital chemical vapor deposition (CVD) method for forming a thickness of a multi-component oxide layer over a substrate comprising:

(i) providing a chemical vapor deposition (CVD) reactor chamber;

(ii) positioning within the chemical vapor deposition (CVD) reactor chamber a substrate;

(iii) forming over the substrate a multi-component oxide precursor layer, the multi-component oxide precursor layer being formed from a multiplicity of precursor reactant source materials comprising at minimum a first precursor reactant source material and a second precursor reactant source material introduced simultaneously into the chemical vapor deposition (CVD) reactor chamber in absence of an oxidant reactant source material; and (iv) oxidizing with the oxidant reactant source material within the chemical vapor deposition (CVD) reactor chamber the multi-component oxide precursor layer formed over the substrate to form the multi-component oxide layer over the substrate, the oxidant reactant source material being introduced into the chemical vapor deposition (CVD) reactor chamber in absence of the first precursor reactant source material and the second precursor reactant source material, wherein:

step (iii) and step (iv) are carried out sequentially and repetitively for a sufficient number of repetitive cycles to yield the multi-component oxide layer over the substrate at the thickness.

13. The method of claim 12 wherein the multi-component oxide layer is formed with an enhanced precursor reactant source material incorporation efficiency of the multiplicity of precursor reactant source materials in comparison with a second multi-component oxide layer formed employing conditions equivalent to the conditions employed in forming the multi-component oxide layer, but with simultaneous introduction into the chemical vapor deposition (CVD) reactor chamber of the first precursor reactant source material, the second precursor reactant source material and the oxidant reactant source material.

14. The method of claim 12 wherein the multi-component oxide layer is formed with an enhanced crystallinity at a lower substrate temperature in comparison with a second multi-component oxide layer formed employing conditions equivalent to the conditions employed in forming the multi-component oxide layer, but with simultaneous introduction into the chemical vapor deposition (CVD) reactor chamber of the first precursor reactant source material, the second precursor reactant source material and the oxidant reactant source material.

15. The method of claim 12 wherein the multi-component oxide layer is selected from the group consisting of barium strontium titanate (BST) layers, bismuth titanate (BT) layers, lead zirconium titanate (PZT) layers, strontium bismuth tantalate (SBT) layers, strontium bismuth niobate tantalate (SBNT) layers, doped lanthanum manganese oxide (LMO) layers, yttrium barium copper oxide (YBCO) layers, and bismuth strontium calcium copper oxide (BSCCO) layers.

16. The method of claim 12 wherein the substrate is employed within a fabrication selected from the group consisting of microelectronics fabrications and sensor fabrications.

17. The method of claim 16 wherein the microelectronics fabrications are selected from the group consisting of integrated circuit microelectronics fabrications, solar cell microelectronics fabrications, ceramic substrate microelectronics fabrications and flat panel display microelectronics fabrications.

18. The method of claim 16 wherein the sensor fabrications are selected from the group consisting of piezoelectric sensor fabrications, pyroelectric sensor fabrications, magnetoresistive (MR) sensor fabrications and chemical gas detector sensor fabrications.

19. The method of claim 12 wherein at minimum the first precursor reactant source material and the second precursor reactant source material are introduced into the chemical vapor deposition (CVD) reactor chamber through a liquid source delivery method.

20. The method of claim 19 wherein the liquid source delivery method employs at minimum a coordinated first precursor reactant source material and a coordinated second precursor reactant source material each of sufficient stability to attenuate a reaction of the coordinated first precursor reactant source material and the coordinated second precursor reactant source material when introducing the coordinated first precursor reactant source material and the coordinated second precursor reactant source material into the chemical vapor deposition (CVD) reactor chamber through the liquid source delivery method.

21. The method of claim 12 wherein the oxidant reactant source material is selected from the group consisting of oxygen, ozone, nitrous oxide, nitric oxide, nitrogen dioxide, water vapor, hydrogen peroxide vapor, mixtures thereof, plasma activated derivatives thereof, UV light activated derivatives thereof, laser activated derivatives thereof, ion activated derivatives thereof, and electron activated derivatives thereof.

22. The method of claim 12 wherein the number of repetitive cycles is from about 5 to about 1000.

23. The method of claim 12 wherein the thickness of the multi-component oxide layer is from about 20 to about 20000 Angstroms.

24. The method of claim 12 further comprising:
   a first purging of at minimum the first precursor reactant source material and the second precursor reactant source material from the chemical vapor deposition (CVD) reactor chamber intervening step (iii) and step (iv); and
   a second purging of the oxidant reactant source material from the chemical vapor deposition (CVD) reactor chamber intervening step (iv) and step (iii).

* * * * *

UNITED STATES PATENT AND TRADEMARK OFFICE
CERTIFICATE OF CORRECTION

PATENT NO.   : PATENT NO : 5,972,430
DATED        : DATED : Oct. 26, 1999
INVENTOR(S)  : INVENTOR(S) :  Frank DiMeo, Jr.; Steven M. Bilodeau; Peter C. Van Buskirk It is certified that error appears in the above-identified patent and that said Letters Patent is hereby corrected as shown below:

Column 2, line 50:   change "(SuntolaH)" to --(Suntola II)--.
Column 2, line 65:   after "(23)" insert --,--.
Columnn 3, line 5:   after "February" delete ".".

Signed and Sealed this

Twenty-seventh Day of February, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO. : 5,972,430
DATED : October 26, 1999
INVENTOR(S) : DiMeo, Jr. et al.

It is certified that error appears in the above-identified patent and that said Letters Patent is hereby corrected as shown below:

Column 1,
Line 4, insert the following text:

-- GOVERNMENT RIGHTS IN INVENTION
This invention was made with the support of the U.S. Government under Contract No. DAAL01-97-C-0079 awarded by the Office of Naval Research. The Government has certain rights in this invention. --

Signed and Sealed this

Thirteenth Day of May, 2003

JAMES E. ROGAN
*Director of the United States Patent and Trademark Office*